United States Patent [19]

Belser

[11] 4,168,535
[45] Sep. 18, 1979

[54] NON-VOLATILE BUBBLE DOMAIN MEMORY SYSTEM

[75] Inventor: Karl A. Belser, Campbell, Calif.

[73] Assignee: International Business Machines Corporation, Armonk, N.Y.

[21] Appl. No.: 826,492

[22] Filed: Aug. 22, 1977

[51] Int. Cl.² .................................. G11C 19/08
[52] U.S. Cl. ...................................... 365/15
[58] Field of Search ................................ 365/14, 15

[56] References Cited

U.S. PATENT DOCUMENTS

| | | | |
|---|---|---|---|
| 3,812,480 | 5/1974 | Kish et al. | 365/15 |
| 4,027,283 | 5/1977 | Tang | 365/15 |
| 4,090,251 | 5/1978 | Flannigan et al. | 365/15 |

FOREIGN PATENT DOCUMENTS 2804695  8/1978  Fed. Rep. of Germany ............ 365/15

Primary Examiner—James W. Moffitt
Attorney, Agent, or Firm—Joseph E. Kieninger

[57] ABSTRACT

A major/minor loop bubble domain memory system maintains the non-volatility of data when subjected to a power on-off-on sequence. A bubble domain shift register is associated with the major/minor loop array and indicates when a block of data in the major loop is in position to be transferred into the minor loops. The length of the shift register is related to the propagation delay of the path over which a bubble is propagated along the major loop from a minor loop read transfer switch to the write transfer switch for the same minor loop.

9 Claims, 1 Drawing Figure

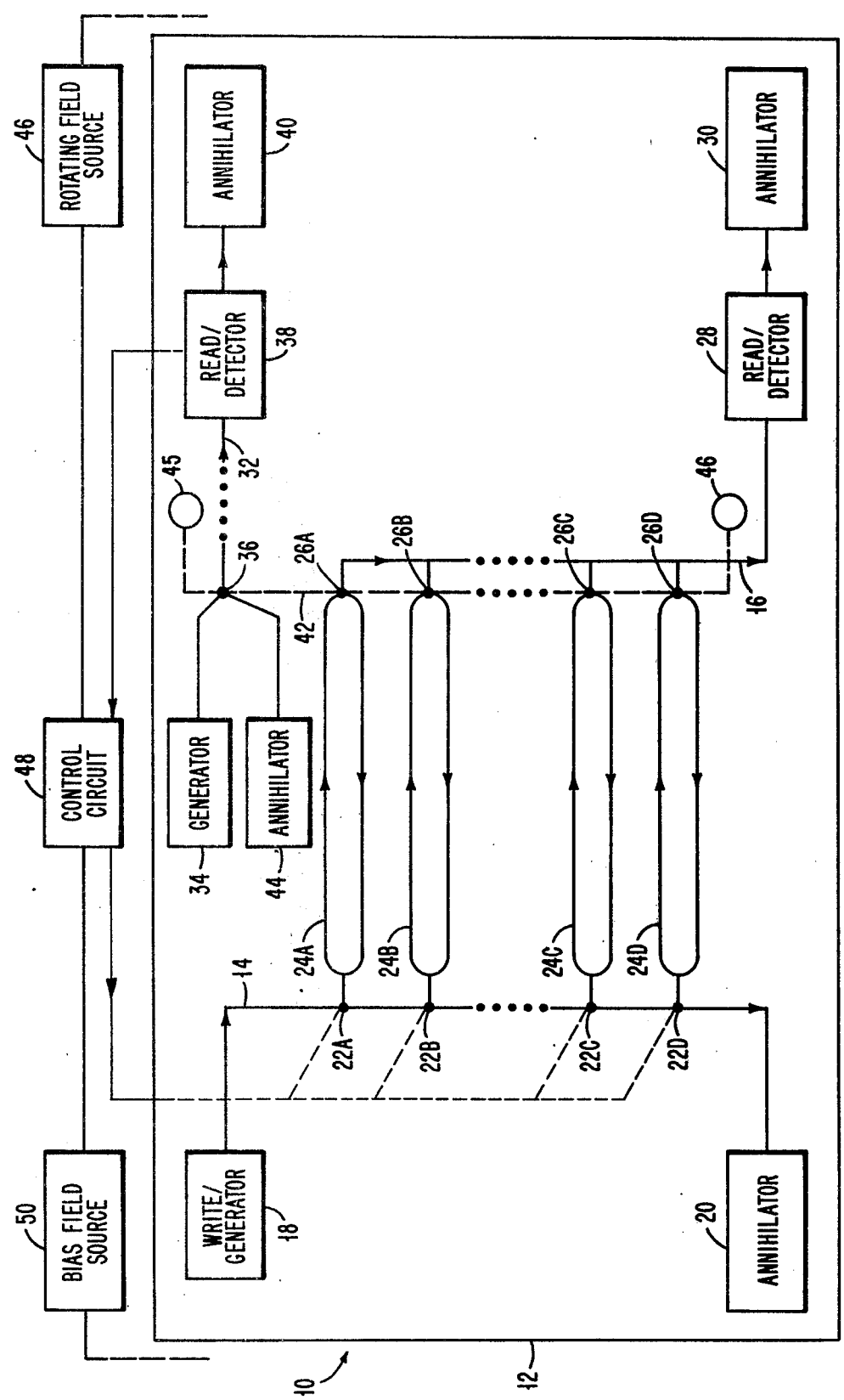

NON-VOLATILE BUBBLE DOMAIN MEMORY SYSTEM

1. Field of the Invention

This invention relates to a major/minor loop bubble domain memory system and, more particularly, to a memory system that maintains the non-volatility of data when subjected to a power on-off-on sequence.

2. Description of the Prior Art

Several different major/minor loop memory organizations are described in U.S. Pat. Nos. 3,618,054, 3,838,407 and 3,999,172. Typically, both the major loop and the minor loop is established by an arrangement of TI-bar or C-bar permalloy type circuits on a film of a magnetic garnet material. The bubble domains are moved around the loop by a magnetic field which rotates in the plane of the magnetic material. The major loop is generally elongated such as to allow a number of minor loops to be aligned along the side. The major loop may be closed as shown in U.S. Pat. No. 3,618,054. With a closed major loop, two-way transfer gates permit the transfer of magnetic domains from the minor loop to the major loop and from the major loop to the minor loop. Major loops may also be of the open type such as disclosed in U.S. Pat. Nos. 3,838,407 and 3,999,172. With the open type of major type, one-way transfer gates from the write channel of the major loop transfer bubbles into one side of the minor loop and another transfer gate permits bubbles to be transferred out of the other end of the minor loop into the read channel of the major loop. Data information stored in the minor loop is circulated until the desired block of data consisting of one bit from each loop reaches the transfer points. On command of a transfer signal, the information is transferred to the read channel of the major loop whereupon it is read by a detector. The detected information, or alternatively new information, is used to control the generation of bubbles which are subsequently propagated along the write channel of the major loop to the write transfer switches.

The relative path lengths of the major loop read and write channels and minor loops are adjusted so that the vacancy created in each minor loop when a block of data is switched out of the minor loops into the read channel will subsequently be in a position in the minor loops to receive the corresponding bit of data from the write channel when the block is switched back into the minor loops. In this manner, data in the minor loops can be routed to the detector in order to be read and then restored back into the minor loops again. Each read transfer operation is followed by a write transfer operation which occurs a fixed number of inplane field cycles later. The number of cycles is equal to the propagation path distance along the major loop from the read transfer switch of any minor loop to the corresponding write transfer switch of the same minor loop. This characteristic is common to the various types of major/minor loop organization.

The non-volatility, i.e., the fact that bubbles are not lost when power is turned off, is one of the primary advantages bubble domains have over competing memory technologies such as charge-coupled devices. In a major/minor loop bubble memory no data is lost when the power is turned off. However, even though the data in the memory is not lost when power is turned off, the relative positions of the data in the memory may be lost. For example, if the power is turned off when data is in the major loop and in the process of being read, information may be lost as to when to strobe the write transfer switches in order to write the data back into the minor loops. In other words, the memory user may not know when a block of data in the major loop is in position to be transferred back into the minor loops. This information is sometimes referred to as the read/write state or status of the bubble memory. This information is typically kept track of by a counter which, for cost effective reasons, is usually a volatile counter, that is, it is powered by a voltage source. When this voltage source fails or is turned off, the count on this counter is lost.

One approach to this problem has been to require the power to be maintained until the major loop has been cleared, that is, until the data has been re-entered into the minor loop. This approach, however, is costly since it requires the use of an energy storage device in the power system such as a very large capacitor or ferroresonant circuit.

Another approach to maintaining the bubble status when a bubble memory is subjected to a power on-off-on sequence is described by Hoffman et al in the article entitled "Designing a Magnetic Bubble Data Recorder" in Computer Design, April, 1976, pages 99–107. In this article, Hoffman et al employ a separate non-volatile core memory which keeps track of the bubble status even after the power is turned off. The use of a core memory with a bubble memory system is expensive since it involves the use of two different types of memory technologies.

SUMMARY OF THE INVENTION

It is a primary object of this invention to provide an improved bubble memory system.

It is another object of this invention to provide an improved major/minor loop bubble memory system.

It is still another object of this invention to provide a nonvolatile major/minor bubble loop memory system.

It is yet another object of this invention to provide a major/minor loop bubble memory system that maintains the nonvolatility of data when subjected to a power on-off-on sequence.

These and other objects are accomplished by a major/minor loop bubble memory system which has a bubble domain shift register associated with the major/minor loop array to indicate when a block of data in the major loop is in position to be transferred into the minor loop. The length between the shift register write means and the shift register detector means corresponds to the propagation delay along the major loop from the read switch means for a specific loop to the write switch means for the same minor loop. When a block of data is transferred out of a minor loop into the major loop read channel, a bubble is also introduced into the shift register. This bubble propagates along the shift register while the block of data is circulated around the major loop and through the data detector means. The bubble in the shift register then reaches the shift register detector means at the same time that the block of data reaches the write transfer switch positions, with each data bit in the block in position for transfer back into the same minor loop from which it was originally obtained. When the shift register detector senses the aforementioned bubble, the resulting signals causes the block of data in the major loop to be transferred back into the minor loops.

Other objects of this invention will be apparent from the following detailed description, reference being made to the accompanying drawing wherein the specific embodiment of the invention is shown.

BRIEF DESCRIPTION OF THE DRAWINGS

FIG. 1 is a schematic view of the major/minor loop bubble memory system in accordance with this invention.

DESCRIPTION OF THE ILLUSTRATIVE EMBODIMENTS

This invention is concerned with a major/minor loop bubble domain memory system which maintains the nonvolatility of data when subjected to a power on-off-on sequence. A power on-off-on sequence is defined as the stopping of bubble propagation at the end of the current cycle, removing the inplane field, and subsequently reapplying the inplane field and starting bubble propagation. As shown in FIG. 1, the bubble domain memory system 10 includes a film 12 of a suitable magnetic material such as a magnetic garnet material. The memory system 10 has a major loop write channel 14 and a major loop read channel 16. A bubble generator 18 for writing data is connected at one end of the write channel 14 and an annihilator 20 is connected at the other end. Along the major loop write channel 14 are write transfer switches 22A, 22B, 22C and 22D as well as other write transfer switches not shown. The write transfer switches 22A, 22B, 22C and 22D which transfer data from the major loop write channel 14 into the minor loops 24A, 24B, 24C and 24D, respectively. Data information is stored in the minor loops 24A-D as is well known in the art. At the end of minor loops 24A-24D are read transfer switches 26A, 26B, 26C and 26D, respectively, which switch the bubbles from the minor loop into the major loop read channel 16. The bubbles are propagated dowm channel 16 to the bubble detector 28 which reads the information. The bubbles are then destroyed by the annihilator 30. As each data bit is read by bubble detector 28, generator 18 is operated to copy the bit into write channel 14, or to replace it with new data. The new or copied block of data is propagated to switches 22A, 22B, 22C and 22D, then transferred into the minor loops.

It is important to observe that reading of data from the major/minor loop array must occur before each write operation. This is because it is not permissible to merge an incoming bubble with a bubble already in a minor loop. Reading of the data first assures a vacancy at that location.

In accordance with this invention, a shift register 32 is associated with the read transfer switches 26A-26D of the minor loops 24A-24D. Its output is used to indicate when a block of data in the major loop is in position in the write channel 14 at switches 22A-22D to be transferred into the minor loops 24A-24D. The shift register 32 has a bubble generator 34 for generating a continuous stream of bubbles, a bubble transfer switch 36, for writing information, and an annihilator 44 for destroying unused bubbles, a bubble detector 38 for reading the data and an annihilator 40 for destroying unused bubbles. A conductor 42 between electrical connectors 45 and 46 passes through the shift register switch 36 and the minor loop read transfer switches 26A-D. A bubble is encoded or switched into the shift register 32 through switch 36 each time the conductor 42 activates the minor loop read transfer switches 26A-D. Each time a bubble is sensed by the shift register detector 38, the major loop write transfer switches 22A-D are activated by conventional means (not shown) to switch bubbles into the minor loops 24A-D. For example, during one inplane cycle the signal from detector 38 is amplified, converted into a "1" or "0" and saved in a flip flop. The output of the flip flop is ANDed with a timing signal to control a driver for the switches 22A-D. The shift register 32 keeps track of a fixed number of cycles delay between the read and write transfer line activations. The length of the shift register 32 between and including the switch 36 and the detector 38 is the same as the propagation path along the major loop read channel 16 from the read transfer switch of any minor loop, for example, 26A, and along the major loop write channel 14 to the corresponding write transfer switch position, for example, 22A, for the same minor loop, for example, 24A.

A bias field supplied by a source 50 maintains a magnetic domain at a desired size while a rotating field source 46 is provided for generating an inplane magnetic field for synchronously advancing the bubble domain simultaneously around the loops and along the paths as has been described. A control circuit 48 performs the customary function of controlling the rotating field switches, generator, detectors, and annihilators as it is well known in the art.

Preferably, the film 12 is a single chip so that both the memory system 10 and the shift register 32 are contained thereon. In another embodiment the shift register 32 is on another chip. While the drawing shows that the shift register 32 is used with one memory system 10, it is understood that one shift register may be used with a plurality of memory systems.

EXAMPLE

A major/minor loop bubble domain memory system has 128 minor loops. Each minor loop including the switch 26 has a length for 512 bits of information. The length of the major loop along the read channel 16 from the minor loop transfer switch 26, for example, 26C, through the detector 28 and along the major loop write channel 14 from generator 18 to write transfer switch 22, for example, 22C, is 255. The length of the shift register 32 from and including switch 36 to and including detector 38 is 255.

When bits of information are switched out of the minor loops 24A-24D into read channel 16, a bubble is switched into the shift register 32 from switch 36. As the bubbles are detected by detector 28, the corresponding information is generated by generator 18 and switched into the write channel 14 by conventional means (not shown). For example, during one inplane cycle the signal from the detector 38 is amplified, cconverted into a "1" or "0" and saved in a flip flop. The output of the flip flop is ANDed with a timing signal to control a driver that operates write generator 18. By the time the block of bubbles switched from 26A-D reach write transfer switches 22A-D, the bubble in shift register 32 will be detected by detector 38. When it is detected, the block of information is then switched into the minor loops through the transfer switches 22A-D. Even though the memory system is subjected to a power on-off-on sequence, none of the data in the shift register is lost. Since none of the data in the shift register is lost when the bubble is detected by detector 38, it indicates that a block of data in the major loop is in position to be transferred into the minor loop.

When power is first turned on after the memory has been stopped, there exists a possibility that data from a previous operation is still in the read channel. This data must be shifted out of the read channel before the read transfer line is strobed to bring new data out of the 5 minor loops. Therefore, the first part of the startup procedure is to clock the memory a number of times equal to the number of propagation delays from the switch 26A to the portion of read channel 16 positioned adjacent to switch 26D. Following the initial clearing of the read channel, the use of the shift register output to control the operation of the write transfer line guarantees that any data initially in the read channel will automatically be restored to its proper position in the minor loops.

Although a preferred embodiment of this invention has been described, it is understood that numerous variations can be made in accordance with the principles of this invention.

What is claimed is:

1. A major/minor loop bubble domain memory system adapted to maintain the nonvolatility of data when subjected to a power on-off-on sequence, the system comprising:
    a bubble domain memory having a major/minor loop array with a major loop write channel and a major loop read channel and adapted for the storage and guided movement of bubble domains, and
    a bubble domain shift register associated with the major/minor loop array of said memory and having bubble switch means that operate concurrently with the transfer of bubbles from the minor loop to the major loop read channel and having annihilator means that always annihilate the bubbles in the shift register after each bubble is sensed wherein said shift register indicates when a block of data in the major loop write channel is in position to be transferred into the minor loops.

2. A major/minor loop bubble domain memory system adapted to maintain the nonvolatility of data when subjected to a power on-off-on sequence, the system comprising:
    a bubble domain memory having a major/minor loop array with a major loop write channel and a major loop read channel and adapted for the storage and guided movement of bubble domains, said major loop write channel having a plurality of write switch means to transfer data encoded as the presence or absence of bubbles into said minor loops, said minor loops having read switch means to transfer data encoded as the presence or absence of bubbles into said major loop read channel, and
    a bubble domain shift register having data input means to transfer bubbles into said shift register and having annihilator means associated therewith, said shift register data input means associated with said minor loop read switch means and adapted to be actuated concurrently therewith wherein said shift register indicates when a block of data in said major loop write channel is in position to be transferred into said minor loops.

3. A system as described in claim 2 wherein said shift register includes detector means adapted to indicate when a block of data in said major loop write channel is in position to be transferred into said minor loops.

4. A system as described in claim 3 having said shift register detector means associated with said major loop write switch means wherein the activation of said detector means by a bubble causes said write switch means to transfer data into said minor loops.

5. A system as described in claim 3 wherein the propagation delay between said shift register data input means and said shift register detector means correspond to the propagation delay along the major loop from a first minor loop read switch means to the major loop write switch means for said first minor loop.

6. A major/minor loop bubble domain memory system adapted to maintain the nonvolatility of data when subjected to a power on-off-on sequence, the system comprising:
    a bubble domain memory having a major/minor loop array with a major loop write channel and a major loop read channel and adapted for the storage and guided movement of bubble domains, said major loop write channel having a plurality of write switch means to transfer data encoded as the presence or absence of bubbles into said minor loops, said minor loops having read switch means to transfer data encoded as the presence or absence of bubbles into said major loop read channel, and
    a bubble domain shift register having a bubble generator means and a write switch means to transfer bubbles into said shift register, said shift register write-switch means associated with said minor loop switch means and adapted to be actuated concurrently therewith wherein said shift register indicates when a block of data in said major loop write channel is in position to be transferred into said minor loops.

7. A system as described in claim 6 wherein said shift register write switch means and said minor loop switch means are activated by a common driver.

8. A system as described in claim 6 wherein a conductor is common to and connects in series said shift register write switch means and said minor loop read switch means.

9. A system as described in claim 7 wherein shift register and said major/minor loop array are positioned on the same chip of bubble supporting material.

* * * * *